(12) United States Patent
DeLoach et al.

(10) Patent No.: US 6,905,943 B2
(45) Date of Patent: Jun. 14, 2005

(54) FORMING A TRENCH TO DEFINE ONE OR MORE ISOLATION REGIONS IN A SEMICONDUCTOR STRUCTURE

(75) Inventors: Juanita DeLoach, Plano, TX (US); Freidoon Mehrad, Plano, TX (US); Brian M. Trentman, Sherman, TX (US); Troy A. Yocum, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/703,387

(22) Filed: Nov. 6, 2003

(65) Prior Publication Data

US 2005/0101101 A1 May 12, 2005

(51) Int. Cl.$^7$ .................................................. H01L 21/76
(52) U.S. Cl. ..................... 438/424; 438/724; 438/734; 438/735; 438/738; 438/739; 438/743; 438/744; 438/755
(58) Field of Search ................... 438/424, 735–740, 438/724, 734, 743, 744, 755

(56) References Cited

U.S. PATENT DOCUMENTS

| | | | | |
|---|---|---|---|---|
| 5,554,256 A | * | 9/1996 | Pruijmboom et al. | 438/424 |
| 5,578,518 A | * | 11/1996 | Koike et al. | 438/424 |
| 5,712,185 A | * | 1/1998 | Tsai et al. | 438/424 |
| 5,766,823 A | * | 6/1998 | Fumitomo | 430/314 |
| 5,910,018 A | * | 6/1999 | Jang | 438/425 |
| 5,940,716 A | * | 8/1999 | Jin et al. | 438/424 |
| 6,040,231 A | * | 3/2000 | Wu | 438/424 |
| 6,080,637 A | * | 6/2000 | Huang et al. | 438/424 |
| 6,121,110 A | * | 9/2000 | Hong et al. | 438/400 |
| 6,153,479 A | * | 11/2000 | Liao et al. | 438/296 |
| 6,235,609 B1 | * | 5/2001 | Sengupta et al. | 438/424 |
| 6,271,143 B1 | | 8/2001 | Mendicino | 438/700 |
| 6,284,623 B1 | * | 9/2001 | Zhang et al. | 438/424 |
| 6,355,538 B1 | * | 3/2002 | Tseng | 438/424 |
| 6,372,602 B1 | * | 4/2002 | Mitsuiki | 438/424 |
| 6,613,648 B1 | * | 9/2003 | Lim et al. | 438/424 |
| 6,716,718 B2 | * | 4/2004 | Nagatani et al. | 438/424 |
| 6,723,617 B1 | * | 4/2004 | Choi | 438/424 |

* cited by examiner

*Primary Examiner*—Mary Wilczewski
*Assistant Examiner*—Toniae M. Thomas
(74) *Attorney, Agent, or Firm*—Jacqueline J. Garner; W. James Brady, III; Frederick J. Telecky, Jr.

(57) ABSTRACT

In one embodiment, a method for forming a semiconductor structure in manufacturing a semiconductor device includes providing a pad layer on a surface of a substrate, providing a nitride layer on the pad layer, and providing a sacrificial oxide layer on the nitride layer. In a first etching step, at least the sacrificial oxide and nitride layers are etched to define opposing substantially vertical surfaces of at least the sacrificial oxide and nitride layers. In a second etching step, the nitride layer is etched such that the opposing substantially vertical surfaces of the nitride layer are recessed from the opposing substantially vertical surfaces of the sacrificial oxide layer, the sacrificial oxide layer substantially preventing the nitride layer from decreasing in thickness as a result of the etching of the nitride layer. In a third etching step, the substrate is etched to form a trench extending into the substrate for purposes of defining one or more isolation regions adjacent the trench.

7 Claims, 4 Drawing Sheets

FORMING A TRENCH TO DEFINE ONE OR MORE ISOLATION REGIONS IN A SEMICONDUCTOR STRUCTURE

TECHNICAL FIELD

This invention relates generally to semiconductor structures, and more particularly to forming a trench to define one or more isolation regions in a semiconductor structure.

BACKGROUND

Integrated circuit fabrication often includes forming an isolation region to define one or more active regions in a substrate of a semiconductor structure. One way to define an isolation region is to form one or more trenches in the substrate using one or more etching processes while masking a silicon or other substrate over what is to be the active region. As an example, this process may be referred to as shallow trench isolation (STI). Subsequent to formation, the trenches may be filled with a fill oxide. The etching processes for forming the isolation regions may lead to various problems, including fill oxide erosion at the interface between the fill oxide and the substrate (i.e. a depression formed at the interface). These problems may degrade transistor performance. For example, these problems may lead to an undesirable "double-hump" in the current-voltage (I-V) curve for the transistor.

Current techniques for reducing fill oxide erosion during formation of the trenches include a "pullback" process performed on a nitride or other mask layer (which overlies the silicon to define the active region). Such pullback processes include a wet chemistry used after etching the trench and either before or after lining the trench with a desired liner oxide layer. However, current pullback processes are problematic. For example, the mask layer may be oxidized by the process for forming the liner oxide layer, creating a variable-depth silicon oxy-nitride layer. This may cause significant variation in the subsequent wet etch rate for stripping the mask layer. As another example, a hydrofluoric (HF) process used to deglaze the oxy-nitride layer prior to hot phosphoric acid being used during nitride removal may erode the liner oxide layer.

SUMMARY

According to the present invention, disadvantages and problems associated with previous techniques for forming isolation regions in a substrate of a semiconductor structure may be reduced or eliminated.

In one embodiment, a method for forming a semiconductor structure in manufacturing a semiconductor device includes providing a pad layer on a surface of a substrate, providing a nitride layer on the pad layer, and providing a sacrificial oxide layer on the nitride layer. In a first etching step, at least the sacrificial oxide and nitride layers are etched to define opposing substantially vertical surfaces of at least the sacrificial oxide and nitride layers. In a second etching step, the nitride layer is etched such that the opposing substantially vertical surfaces of the nitride layer are recessed from the opposing substantially vertical surfaces of the sacrificial oxide layer, the sacrificial oxide layer substantially preventing the nitride layer from decreasing in thickness as a result of the etching of the nitride layer. In a third etching step, the substrate is etched to form a trench extending into the substrate for purposes of defining one or more isolation regions adjacent the trench.

Particular embodiments of the present invention may provide one or more technical advantages. For example, by performing the second etching step (i.e. the pullback process), fill oxide erosion at the interface between the fill oxide and the substrate (i.e. a depression formed at the interface) may be reduced or eliminated. This may improve transistor performance by reducing or eliminating an undesirable double-hump in the current-voltage (I-V) curve for the transistor, for example.

As another example, by providing a sacrificial oxide layer over the nitride or other mask layer, reduction in the thickness of the nitride layer during at least the second etching step may be substantially prevented. Providing this protection for the surface of the nitride layer may reduce or eliminate the need to provide additional nitride to compensate for the reduction in thickness of the nitride layer associated with previous techniques. Additionally, the sacrificial oxide layer may protect the top surface of the nitride layer from exposure to subsequent etching chemistries for forming one or more trenches. Certain of these etching chemistries may cause a silicon oxy-nitride layer, which may be variable in depth, to form on the top surface of the nitride layer. Formation of this silicon oxy-nitride layer on the top surface of the nitride layer may require an HF or other process to remove the silicon oxy-nitride layer (i.e. to deglaze the nitride layer) prior to a subsequent etching process for removing the nitride layer. This HF or other process may damage a desirable liner oxide layer formed in the trenches. Thus, the sacrificial oxide layer may protect the surface of the nitride layer from exposure to certain etching chemistries during this or certain subsequent etching processes, thereby eliminating the need for the deglazing process.

As another example, by forming the trench subsequent to performing the first and second etching steps, a liner oxide process for lining the surface of the substrate in the trench may be performed after the second etching step. This may prevent damage to the liner oxide layer caused by the second etching step because the liner oxide layer is not formed until after the second etching step is performed. Thus, in one embodiment, the advantages of the second etching step may be achieved while damage to the liner oxide layer caused by previous techniques may be reduced or eliminated.

Certain embodiments of the present invention may provide some, all, or none of the above technical advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

FIGS. 1A–1H illustrate an example process for forming a semiconductor structure 10 in manufacturing a semiconductor device, which may provide for improved trench isolation regions of semiconductor structure 10 and in which, subsequent to pad oxide layer breakthrough, a pullback process is performed using a sacrificial oxide layer. In one embodiment, isolation regions such as may be formed during shallow trench isolation (STI), for example, may be formed to define one or more active regions of semiconductor structure 10. For example, an active region may be the location in semiconductor structure 10 a which a gate component of a semiconductor device may eventually be formed.

Figure 1A:
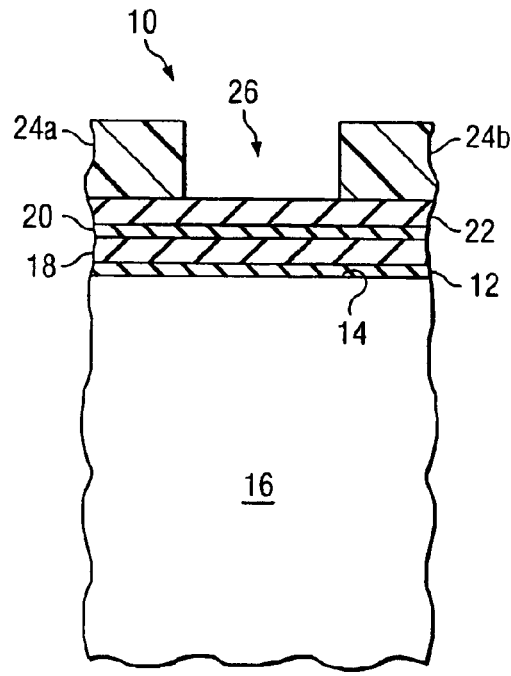
FIGS. 1A–1H illustrate an example process for forming a semiconductor structure in manufacturing a semiconductor device, which may provide for improved trench isolation regions of the semiconductor structure and in which, subsequent to pad oxide layer breakthrough, a pullback process is performed using a sacrificial oxide layer.

As shown in FIG. 1A, a pad layer 12 such as a pad oxide layer may be provided on a surface 14 of a silicon or other substrate 16. While surface 14 is illustrated as being flat, surface 14 may include any suitable contours according to particular needs or manufacturing tolerances, for example. In one embodiment, pad layer 12 is grown on surface 14 of substrate 16. Pad layer 12 may include silicon dioxide ($SiO_2$) or any other material suitable for use as a pad layer. In one embodiment, pad layer 12 is approximately 50–200 Å thick, although the present invention contemplates pad layer 12 having any suitable thickness according to particular needs. Furthermore, the present invention contemplates forming semiconductor structure 10 without pad layer 12.

A nitride or other mask layer 18 may be deposited or otherwise provided on pad layer 12. Nitride layer 18 may be used to define an active region such as a moat of semiconductor structure 10. Nitride layer 18 may include silicon nitride ($Si_3N_4$), silicon-rich silicon nitride, silicon oxynitride ($Si_x$—$O_y$—$N_z$, where x, y, and z may be any suitable numbers, depending on the elements or compounds involved in the chemical reaction), a low-pressure chemical vapor deposition (LPCVD) nitride, or any other material suitable for use as a mask. Nitride layer 18 may be approximately 800–1600 Å thick, although the present invention contemplates nitride layer 18 having any suitable thickness according to particular needs. Typically, pad layer 12 substantially separates nitride layer 18 from substrate 16. In an embodiment in which pad layer 12 is not present, nitride layer 18 may be provided directly on surface 14 of substrate 16.

A sacrificial oxide layer 20 may be deposited or otherwise provided on nitride layer 18. Sacrificial oxide layer 20 may include any suitable material according to particular needs. Sacrificial oxide layer 20 may be approximately 200–600 Å thick, although the present invention contemplates sacrificial oxide layer 20 having any suitable thickness according to particular needs. As will be discussed in more detail below, sacrificial oxide layer 20 may serve to protect portions of nitride layer 18 during subsequent etching processes.

A bottom anti-reflective coating (BARC) layer 22 may be deposited or otherwise provided on sacrificial oxide layer 20. BARC layer 22 may serve as a protective layer to protect the layers underlying it from damage during subsequent etching processes. For photolithography purposes, BARC layer 22 may aid in mask patterning by reducing film interference. In one embodiment, BARC layer 22 includes an organic material, although the present invention contemplates BARC layer 22 including any suitable material according to particular needs.

A photoresist or other resist layer 24 including portions 24a and 24b may be provided on BARC layer 22 in a patterning step in which an area of resist layer 24 has been selectively removed. Portions 24a and 24b of resist layer 24 may define an opening 26 where the area of resist layer 24 has been selectively removed. Generally, opening 26 defines an area where a trench, such as may be formed during an STI process, for isolating one or more active regions may be formed. In one embodiment, resist layer 24 may function as an etch stop layer when performing various etching processes on semiconductor structure 10.

Figure 1B:
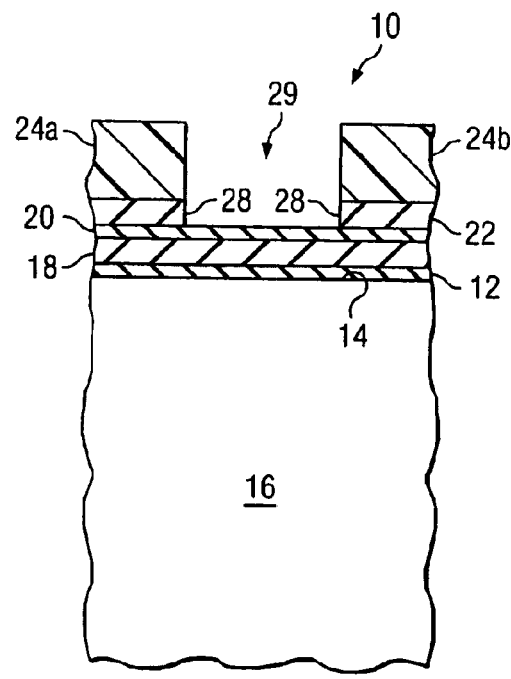

As shown in FIG. 1B, an etching process may be performed to etch through BARC layer 22 in opening 26 to define opposing substantially vertical surfaces 28 of BARC layer 22 and to begin formation of a trench 29. For example, a dry etching process such as a plasma etching process may be performed to extend opening 26 through BARC layer 22 to define opposing substantially vertical surfaces 28 and to begin formation of trench 29. Such a dry etching process may be performed in a plasma etcher. The term "vertical" as used to describe substantially vertical surfaces throughout this description is meant to refer to a direction that is substantially perpendicular to surface 14 of substrate 16.

Figure 1C:
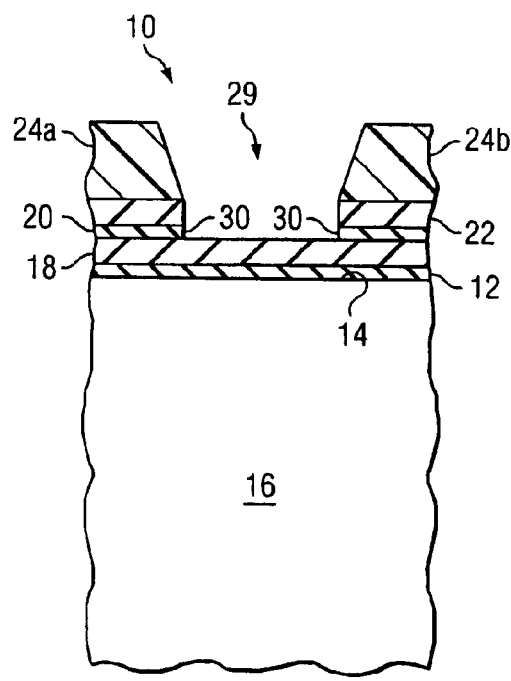

As shown in FIG. 1C, an etching process may be performed to etch through sacrificial oxide layer 20 in trench 29 to define opposing substantially vertical surfaces 30 of sacrificial oxide layer 20. For example, a dry etching process such as a plasma etching process may be performed to extend trench 29 through sacrificial oxide layer 20 to define opposing substantially vertical surfaces 30 of sacrificial oxide layer 20. Such a dry etching process may be performed in a plasma etcher. In one embodiment, plasma etching of BARC layer 22 and plasma etching of sacrificial oxide layer 20 are performed in one substantially continuous process without removing semiconductor structure 10 from the plasma etcher. In one embodiment, etching of BARC layer 22 and etching of sacrificial oxide layer 20 may be performed as a single etching step, although the present invention contemplates etching of BARC layer 22 and sacrificial oxide layer 20 in separate etching steps.

Figure 1D:
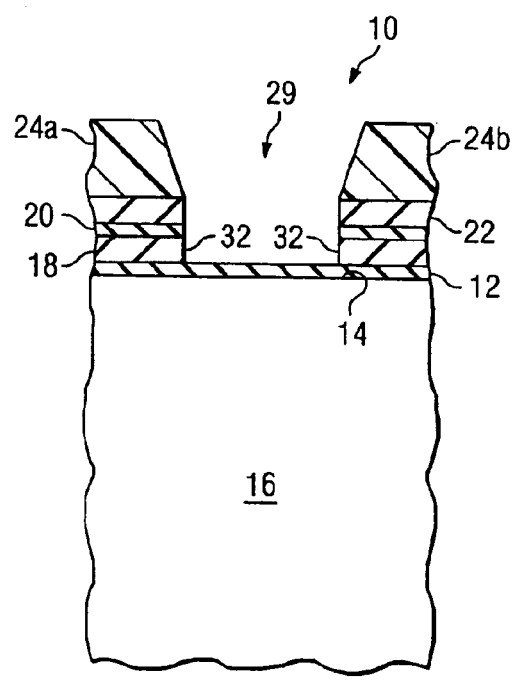

As shown in FIG. 1D, an etching process may be performed to etch through nitride layer 18 in trench 29 to define opposing substantially vertical surfaces 32 of nitride layer 18. For example, a dry etching process such as a plasma etching process may be performed to extend trench 29 through nitride layer 18 to define opposing substantially vertical surfaces 32 of nitride layer 18. Such a dry etching process may be performed in a plasma etcher. In one embodiment, plasma etching of sacrificial oxide layer 20 and plasma etching of nitride layer 18 are performed in one substantially continuous process without removing semiconductor structure 10 from the plasma etcher. In one embodiment, etching of sacrificial oxide layer 20 and etching of nitride layer 18 may be performed as a single etching step, although the present invention contemplates etching of sacrificial oxide layer 20 and nitride layer 18 in separate etching steps. Etching of sacrificial oxide layer 20 and nitride layer 18 may be collectively referred to as a first etching step.

Figure 1E:
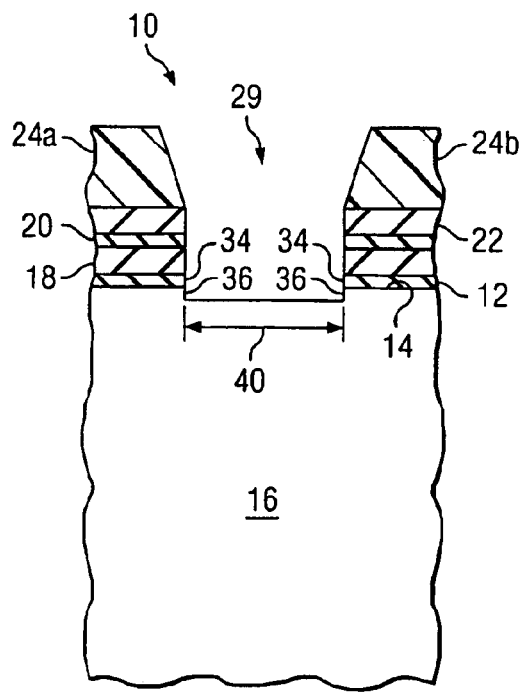

As shown in FIG. 1E, where pad layer 12 is present, an etching process may be performed to etch at least through pad layer 12 in trench 29 to define opposing substantially vertical surfaces 34 of pad layer 12. For example, a dry etching process such as a plasma etching process may be performed to extend trench 29 through at least pad layer 12 to define opposing substantially vertical surfaces 34 of pad layer 12. Such a dry etching process may be performed in a plasma etcher. In one embodiment, plasma etching of sacrificial oxide layer 20, nitride layer 18, and pad layer 12 are performed in one substantially continuous process without removing semiconductor structure 10 from the plasma etcher. In one embodiment, the first etching step may further include etching pad layer 12, in addition to etching sacrificial oxide layer 20 and nitride layer 18, to define opposing substantially vertical surfaces 34 of pad layer 12.

In the embodiment illustrated in FIGS. 1A–1H, the etching process may etch through pad layer 12 into a portion of substrate 16 to define opposing substantially vertical surfaces 36 of substrate 16. This may be referred to as an "over-etch step," which includes an "oxide breakthrough." Furthermore, in an embodiment in which the over-etch step is performed, the first etching step may further include etching the portion of substrate 16, in addition to etching pad layer 12, nitride layer 18, and sacrificial oxide layer 20, to define opposing substantially vertical surfaces 36 of substrate 16. The opposing substantially vertical portions 36 of substrate 16 may have a height of approximately 100–200 Å, although the present invention contemplates opposing substantially vertical portions 36 of substrate 16 having any suitable heights according to particular needs. In one embodiment, performing this over-etch step may allow for more precise definition of a critical dimension 40 in substrate 16 between opposing substantially vertical surfaces 36 of substrate 16. In one embodiment, plasma etching of pad layer 12 and plasma etching of the portion of substrate 16 are performed in one substantially continuous process without removing semiconductor structure 10 from the plasma etcher. In one embodiment, etching of pad layer 12 and etching of the portion of substrate 16 may be performed as a single etching step, although the present invention contemplates etching of pad layer 12 and the portion of substrate 16 in separate etching steps.

Figure 1F:
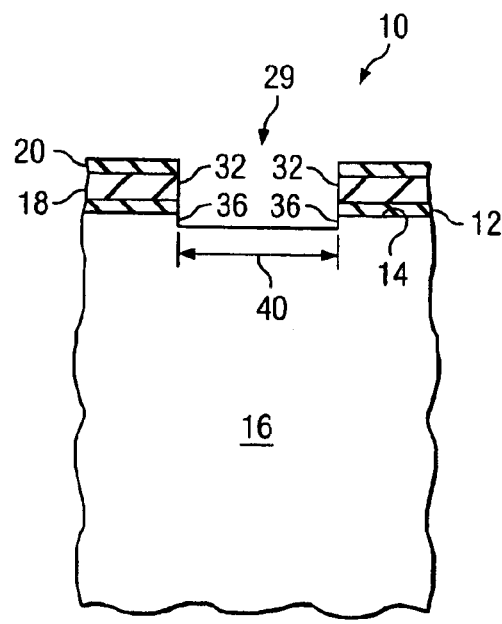

As shown in FIG. 1F, resist layer 24 and BARC layer 22 may be removed by any suitable etching process or processes. In one embodiment, an in situ dry etching process such as a plasma etching process may be performed to remove resist layer 24 and BARC layer 22. The dry etching process may include an ash process, which may involve plasma ion bombardment. The in situ dry etching process may be performed without removing semiconductor structure 10 from the plasma etcher used in previous etching steps. In another embodiment, an ex situ wet or dry etching process may be performed to remove resist layer 24 and BARC layer 22. To perform the ex situ wet or dry etching process, semiconductor structure 10 may be removed from the plasma etcher and exposed to either a wet or dry etching chemistry to remove resist layer 24 and BARC layer 22.

Figure 1G:
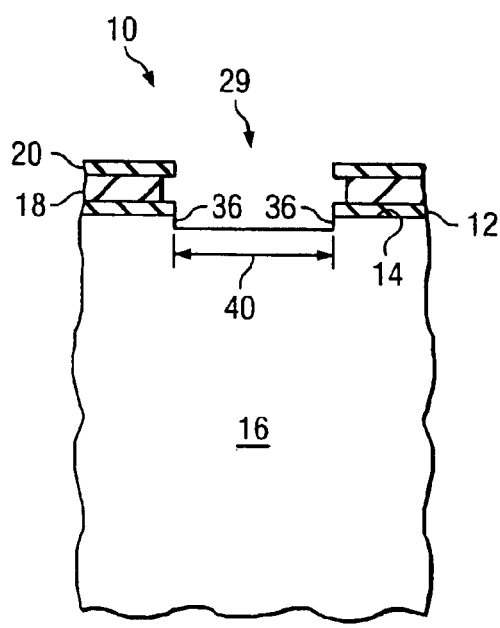

As shown in FIG. 1G, an etching process may be performed to etch nitride layer 18 such that opposing substantially vertical portions 32 of nitride layer 18 are recessed from opposing substantially vertical surfaces 30 of sacrificial oxide layer 20, sacrificial oxide layer 20 substantially preventing nitride layer 18 from decreasing in thickness as a result of the etching of nitride layer 18 in this step. This etching step may be referred to as a "pullback" step in which the opposing substantially vertical portions 32 of nitride layer 18 are "pulled back" from opposing substantially vertical surfaces 30 of sacrificial oxide layer 20. Furthermore, this pullback step may also be referred to in this description as a second etching step. In one embodiment, the second etching step includes wet etching nitride layer 18 using a phosphoric acid, for example. In another embodiment, the second etching step includes dry etching nitride layer 18 using a plasma etcher. In this embodiment, it may be unnecessary to remove semiconductor structure 10 from the plasma etcher used in previous steps to perform the second etching step, which may provide additional advantages.

Performing the second etching step may be desirable to help reduce fill oxide loss (i.e. formation of a depression) at the interface between a fill oxide and substrate 16. Additionally, it may be undesirable for nitride layer 18 to decrease in thickness during performance of the second etching step, for example. Sacrificial oxide layer 20 may substantially prevent nitride layer 18 from decreasing in thickness during performance of the second etching step, for example. Certain amounts of etching of nitride layer 18 may occur at the corners of nitride layer 18, for example, reducing the thickness of nitride layer 18 in certain areas. The present invention is meant to encompass this type of insignificant reduction in the thickness of nitride layer 18, as long as the thickness of nitride layer 18 is substantially preserved. Furthermore, it may be undesirable for a top surface of nitride layer 18 to be exposed to subsequent etching chemistries for forming trench 29 because certain of these etching chemistries may cause a silicon oxy-nitride layer, which may be variable in depth, to form on the top surface of nitride layer 18. Formation of this silicon oxy-nitride layer on the top surface of nitride layer 18 may require an HF or other process to remove the silicon oxy-nitride layer (i.e. to deglaze nitride layer 18) prior to a subsequent etching process for removing nitride layer 18. This HF or other process may damage a desirable liner oxide layer formed in trench 29. Thus, it may be desirable to include sacrificial oxide layer 20 to protect the surface of nitride layer 18 from exposure to certain etching chemistries during this or certain subsequent etching processes.

Figure 1H:
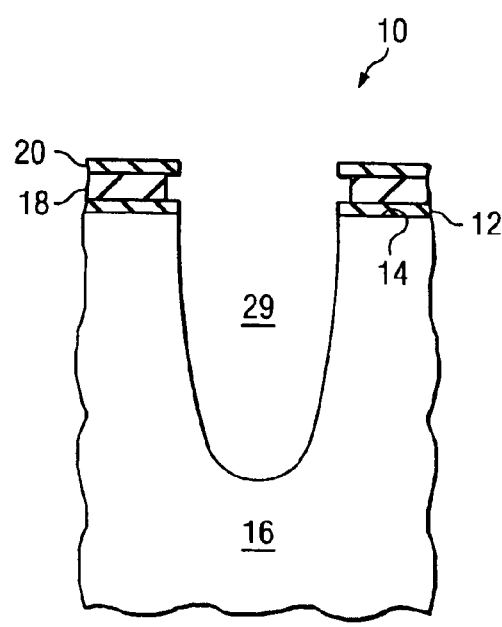

As shown in FIG. 1H, an etching process may be performed to etch substrate 16 to extend trench 29 further into substrate 16 for purposes of defining one or more isolation regions adjacent trench 29. Trench 29 may be etched to any suitable depth and may have any suitable width, according to particular needs. In one embodiment, the trench is approximately 4,000 Å deep from surface 14 of substrate 16. In one embodiment, having performed the over-etch step of nitride layer 18 into substrate 16 (i.e. as shown in FIG. 1E) to more precisely define critical dimension 40 may improve definition of trench 29. In one embodiment, any suitable portion of sacrificial oxide layer 20 may be etched while performing the etching process to etch substrate 16 to extend trench 29 further into substrate 16. Additional process steps may include a liner oxide process to line the top surface of substrate 16 within trench 29 with an oxide layer, a fill process to fill trench 29 with an STP or other fill oxide, a chemical mechanical process (CMP), a wet nitride strip, or any other suitable processes.

Although the process steps described with reference to FIGS. 1A–1H are described in a particular order, the present invention contemplates certain steps being performed in any suitable order and certain etching steps being combined according to particular needs. For example, sacrificial oxide layer 20 and pad layer 12 may be etched in one etching step. As another example, the entire process for forming trench 29 may be performed in the plasma etcher without removing semiconductor structure 10 from the plasma etcher. Additionally, although semiconductor structure 10 is illustrated and described as having a particular form and including particular materials, the present invention contemplates semiconductor structure 10 having any suitable form and including any suitable materials according to particular needs. Furthermore, although semiconductor structure 10 is illustrated and described as including particular layers, the present invention contemplates omission of certain layers or addition of other layers according to particular needs.

FIGS. 2A–2H illustrate an example process for forming a semiconductor structure 10 in manufacturing a semiconductor device, which may provide for improved trench isolation regions of semiconductor structure 10 and in which, prior to pad oxide layer breakthrough, a pullback process is performed using sacrificial oxide layer 20. The process steps illustrated in FIGS. 2A–2D may be substantially similar to the process steps described above with reference to FIGS. 1A–1D and thus, those process steps will not be repeated.

Figure 2A:
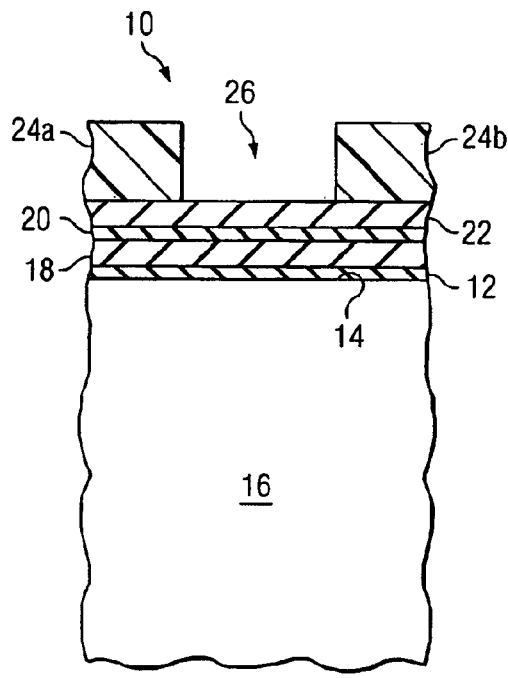
FIGS. 2A–2H illustrate an example process for forming a semiconductor structure in manufacturing a semiconductor device, which may provide for improved trench isolation regions of the semiconductor structure and in which, prior to pad oxide layer breakthrough, a pullback process is performed using a sacrificial oxide layer.
Figure 2B:
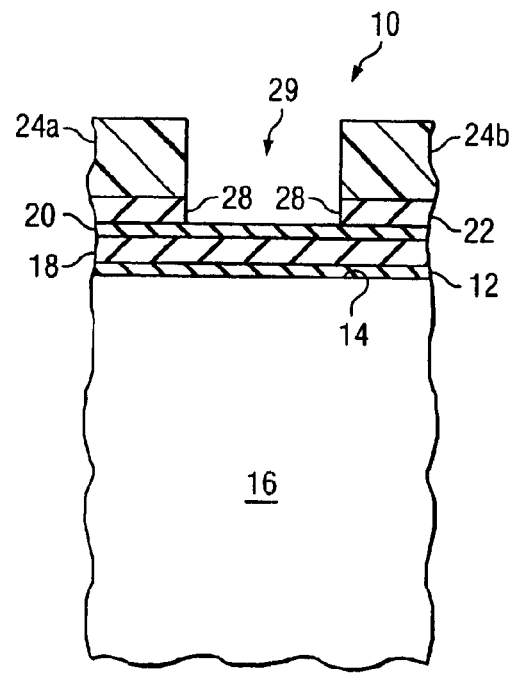
Figure 2C:
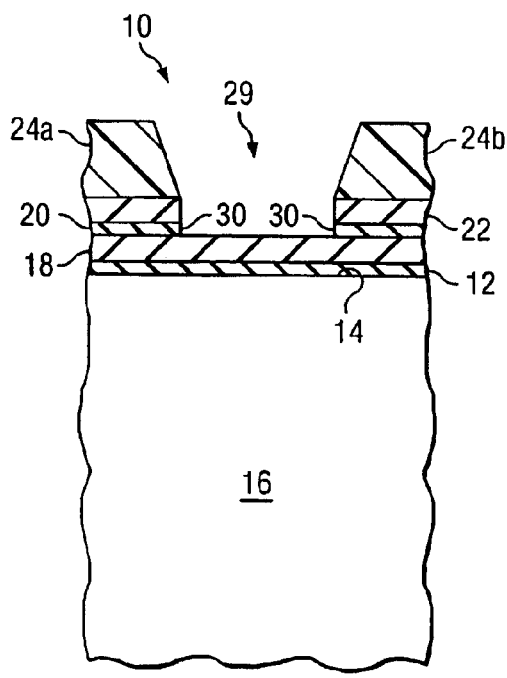
Figure 2D:
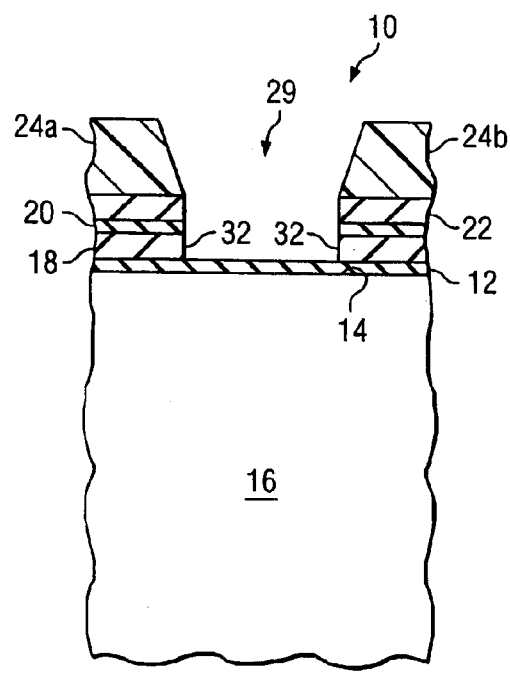
Figure 2E:
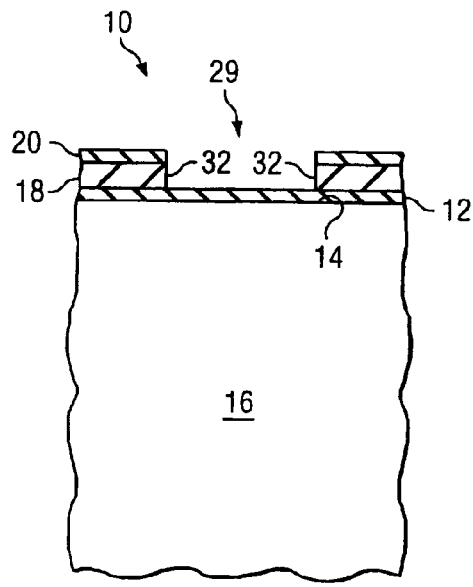

As shown in FIG. 2E, resist layer 24 and BARC layer 22 may be removed by any suitable etching process or processes. In one embodiment, an in situ dry etching process such as a plasma etching process may be performed to remove resist layer 24 and BARC layer 22. The dry etching process may include an ash process, which may include plasma ion bombardment. The in situ dry etching process may be performed without removing semiconductor structure 10 from the plasma etcher used in previous etching steps. In another embodiment, an ex situ wet or dry etching process may be performed to remove resist layer 24 and BARC layer 22. To perform the ex situ wet or dry etching process, semiconductor structure 10 may be removed from the plasma etcher and exposed to either a wet or dry etching chemistry to remove resist layer 24 and BARC layer 22.

Figure 2F:
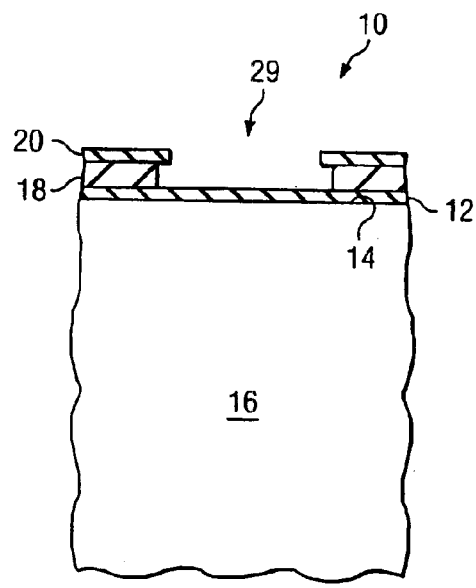

As shown in FIG. 2F, an etching process may be performed to etch nitride layer 18 such that opposing substantially vertical surfaces 32 of nitride layer 18 are recessed from opposing substantially vertical surfaces 30 of sacrificial oxide layer 20, sacrificial oxide layer 20 substantially preventing nitride layer 18 from decreasing in thickness as a result of the etching of nitride layer 18 in this step. This step may be substantially similar to the pullback or second etching step described above with reference to FIG. 1G and may provide similar advantages. As discussed above, the pullback process may, in one embodiment, include wet etching nitride layer 18 using a phosphoric acid, for example. In another embodiment, the pullback process includes dry etching nitride layer 18 using a plasma etcher. In this embodiment, it may be unnecessary to remove semiconductor structure 10 from the plasma etcher used in previous steps to perform the second etching step, which may provide additional advantages.

In contrast to the second etching step described above with reference to FIG. 1G, as shown in FIG. 2F, at least a portion of pad layer 12 remains in trench 29 overlying substrate 16 when the second etching step is performed. In this embodiment, for example, the first etching step does not include etching through pad layer 12 into a portion of substrate 16 to define opposing substantially vertical surfaces 36 of substrate 16. In one embodiment, the first etching step also does not include etching pad layer 12, in addition to etching sacrificial oxide layer 20 and nitride layer 18, to define opposing substantially vertical surfaces 34 of pad layer 12. It should be noted, however, that some etching into pad layer 12 may occur at this step without departing from the scope of the present invention. Thus, in the embodiment illustrated in FIGS. 2A–2H, the second etching step is performed prior to pad layer 12 breakthrough. In one embodiment, by not etching completely through pad layer 12 and thereby exposing the top surface 14 of substrate 16 in trench 29, the present invention may protect substrate 16, particularly the top surface 14 of substrate 16 in trench 29, from exposure to certain subsequent etching chemistries, for example, while performing a subsequent second etching step.

Figure 2G:
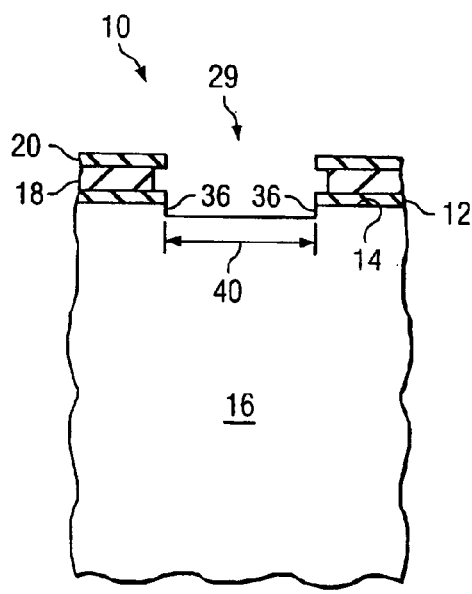

As shown in FIG. 2G, where pad layer 12 is present, an etching process may be performed to etch at least through pad layer 12 in trench 29 to define opposing substantially vertical surfaces 34 of pad layer 12. For example, a dry etching process such as a plasma etching process may be performed to extend trench 29 through at least pad layer 12 to define opposing substantially vertical surfaces 34 of pad layer 12. Such a dry etching process may be performed in a plasma etcher. In an embodiment in which the pullback process was performed by dry etching nitride layer 18 in a plasma etcher, it may be unnecessary to remove semiconductor 10 from the plasma etcher.

In the embodiment illustrated in FIG. 2G, the etching process may etch through-pad layer 12 into a portion of substrate 16 to define opposing substantially vertical surfaces 36 of substrate 16. This may be referred to as an "over-etch step," which includes an "oxide breakthrough." In contrast to the process described above with reference to FIGS. 1A–1H, this oxide breakthrough step is performed subsequent to the pullback process described with reference to FIG. 2F.

Figure 2H:
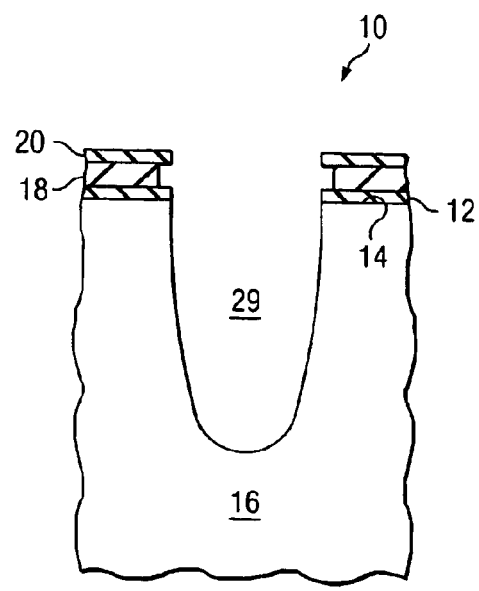

As shown in FIG. 2H, an etching process similar to the one described above with reference to FIG. 1H may be performed to etch substrate 16 to extend trench 29 further into substrate 16 for purposes of defining one or more isolation regions adjacent trench 29. Trench 29 may be etched to any suitable depth and may have any suitable width, according to particular needs. In one embodiment, the trench is approximately 4,000 Å deep from surface 14 of substrate 16. In one embodiment, any suitable portion of sacrificial oxide layer 20 may be etched while performing the etching process to etch substrate 16 to extend trench 29 further into substrate 16. Additional process steps may include a lineroxide process to line the top surface 14 of substrate 16 within trench 29 with an oxide layer, a fill process to fill trench 29 with an STP or other fill oxide, a chemical mechanical process (CMP), a wet nitride strip, or any other suitable processes.

Particular embodiments of the present invention may provide one or more technical advantages. For example, by performing the second etching step (i.e. the pullback process), fill oxide erosion at the interface between the fill oxide and substrate 16 (i.e. a depression formed at the interface) may be reduced or eliminated. This may improve transistor performance by reducing or eliminating an undesirable double-hump in the current-voltage (I-V) curve for the transistor, for example.

As another example, by providing sacrificial oxide layer 20 over nitride or other mask layer 18, reduction in the thickness of nitride layer 18 during at least the second etching step may be substantially prevented. Providing this protection for the surface of nitride layer 18 may reduce or eliminate the need to provide additional nitride to compensate for the reduction in thickness of nitride layer 18 associated with previous techniques. Additionally, sacrificial oxide layer 20 may protect the top surface of nitride layer 18 from exposure to subsequent etching chemistries for forming one or more trenches 29. Certain of these etching chemistries may cause a silicon oxy-nitride layer, which may be variable in depth, to form on the top surface of nitride layer 18. Formation of this silicon oxy-nitride layer on the top surface of nitride layer 18 may require an HF or other process to remove the silicon oxy-nitride layer (i.e. to deglaze nitride layer 18) prior to a subsequent etching process for removing nitride layer 18. This HF or other process may damage a desirable liner oxide layer formed in trenches 29. Thus, sacrificial oxide layer 20 may protect the surface of nitride layer 18 from exposure to certain etching chemistries during this certain subsequent etching processes, thereby eliminating the need for the deglazing process.

As another example, by forming trench 29 subsequent to performing the first and second etching steps, a liner oxide process for lining surface 14 of substrate 16 in trench 29 may be performed after the second etching step. This may prevent damage to the liner oxide layer caused by the second etching step because the liner oxide layer is not formed until after the second etching step is performed. Thus, in one embodiment, the advantages of the second etching step may be achieved while damage to the liner oxide layer caused by previous techniques may be reduced or eliminated.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for forming a semiconductor structure in manufacturing a semiconductor device, comprising:
    providing a pad layer on a surface of a substrate;
    providing a nitride layer on the pad layer;
    providing a sacrificial oxide layer on the nitride layer;
    in a first etching step, etching at least the sacrificial oxide and nitride layers to define opposing substantially vertical surfaces of at least the sacrificial oxide and nitride layers;
    in a second etching step, etching the nitride layer such that the opposing substantially vertical surfaces of the nitride layer are recessed from the opposing substantially vertical surfaces of the sacrificial oxide layer, the sacrificial oxide layer substantially preventing the nitride layer from decreasing in thickness as a result of the etching of the nitride layer; and
    in a third etching step, etching the substrate to form a trench extending into the substrate for purposes of defining one or more isolation regions adjacent the trench;
    wherein the first etching step comprises etching the pad layer, in addition to etching sacrificial oxide and nitride layers, to define opposing substantially vertical surfaces of the pad layer; and
    wherein the first etching step comprises etching a portion of the substrate, in addition to etching the sacrificial oxide, nitride, and pad layers, to define opposing substantially vertical surfaces of the substrate.

2. The method of claim 1, wherein nitride layer comprises at least one of
    silicon nitride;
    silicon-rich silicon nitride; and
    silicon oxy-nitride.

3. The method of claim 1, wherein the opposing substantially vertical portions of the substrate have a height of approximately 100 Å to approximately 200 Å.

4. A method for forming a semiconductor structure in manufacturing a semiconductor device, comprising:
    providing a pad layer on a surface of a substrate;
    providing a nitride layer on the pad layer;
    providing a sacrificial oxide layer on the nitride layer;
    in a first etching step, etching at least the sacrificial oxide and nitride layers to define opposing substantially vertical surfaces of at least the sacrificial oxide and nitride layers;
    in a second etching step, etching the nitride layer such that the opposing substantially vertical surfaces of the nitride layer are recessed from the opposing substantially vertical surfaces of the sacrificial oxide layer, the sacrificial oxide layer substantially preventing the nitride layer from decreasing in thickness as a result of the etching of the nitride layer; and
    in a third etching step, etching the substrate to form a trench extending into the substrate for purposes of defining one or more isolation regions adjacent the trench;
    further comprising, subsequent to the second etching step and prior to the third etching step:
    etching the pad layer to define opposing substantially vertical surfaces of the pad layer; and
    etching a portion of the substrate to define opposing substantially vertical surfaces of the substrate.

5. The method of claim 1, wherein the second etching step comprises wet etching the nitride layer using a phosphoric acid.

6. The method of claim 1, wherein the second etching step comprises dry etching the nitride layer using a plasma etcher.

7. The method of claim 6, wherein the entire method is performed in the plasma etcher without removing the semiconductor structure from the plasma etcher.

* * * * *